United States Patent
Chen et al.

(10) Patent No.: US 9,559,069 B2
(45) Date of Patent: Jan. 31, 2017

(54) SEMICONDUCTOR DEVICE, INTEGRATED CIRCUIT STRUCTURE USING THE SAME, AND MANUFACTURING METHOD THEREOF

(71) Applicant: TAIWAN SEMICONDUCTOR MANUFACTURING CO., LTD., Hsinchu (TW)

(72) Inventors: Yu-Feng Chen, Hsinchu (TW); Chen-Shien Chen, Zhubei (TW); Sheng-Yu Wu, Hsinhcu (TW); Tin-Hao Kuo, Hsinchu (TW); Yen-Liang Lin, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/609,023

(22) Filed: Jan. 29, 2015

(65) Prior Publication Data
US 2016/0225729 A1    Aug. 4, 2016

(51) Int. Cl.
*H01L 23/48* (2006.01)
*H01L 23/00* (2006.01)

(52) U.S. Cl.
CPC ............... *H01L 24/05* (2013.01); *H01L 24/03* (2013.01); *H01L 2224/0401* (2013.01); *H01L 2224/05017* (2013.01); *H01L 2224/05565* (2013.01)

(58) Field of Classification Search
CPC . H01L 21/4885; H01L 23/49816; H01L 33/62
See application file for complete search history.

(56) References Cited

U.S. PATENT DOCUMENTS

| 6,551,916 | B2 | 4/2003 | Lin et al. |
| 8,546,941 | B2 | 10/2013 | Chen et al. |
| 2008/0251916 | A1 | 10/2008 | Cheng et al. |
| 2011/0101526 | A1 | 5/2011 | Hsiao et al. |
| 2013/0093081 | A1* | 4/2013 | Lin .................. H01L 24/11 257/737 |
| 2014/0322863 | A1 | 10/2014 | Lin |

FOREIGN PATENT DOCUMENTS

| JP | H11-330121 A | 11/1999 |
| KR | 10-2014-0051031 A | 4/2014 |

OTHER PUBLICATIONS

Pending U.S. Appl. No. 14/302,117, filed Jun. 11, 2014.

* cited by examiner

*Primary Examiner* — Elias M Ullah
(74) *Attorney, Agent, or Firm* — Maschoff Brennan

(57) ABSTRACT

A semiconductor device includes a substrate, a semiconductor structure, a metal pad, and a stress releasing material. The semiconductor structure is disposed on the substrate. The metal pad is disposed on the semiconductor structure. The metal pad includes a through hole therein. The stress releasing material is disposed in the through hole.

20 Claims, 6 Drawing Sheets

SEMICONDUCTOR DEVICE, INTEGRATED CIRCUIT STRUCTURE USING THE SAME, AND MANUFACTURING METHOD THEREOF

BACKGROUND

As development of integrated circuit (IC), the semiconductor industry has experienced continued rapid growth due to continuous improvements in the integration density of various electronic components such as transistors, diodes, resistors, capacitors, and the like. For the most part, these improvements in integration density have come from repeated reductions in minimum feature size, which allows more components to be integrated into a given area. These integration improvements are essentially two-dimensional in nature, in that the area occupied by the integrated components is essentially on the surface of the semiconductor wafer. Various techniques have been developed to attempt to incorporate extra dimensionality into IC structures. One technique is referred to as a two and a half dimensional structure. These structures typically have interposers having a die stacked on the interposer. Interposers have been used to redistribute ball contact areas from that of the chip to a larger area of the interposer. Other techniques stack chips in a three dimensional (3D) structure, which allows for greater functionality with a reduced footprint of the structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
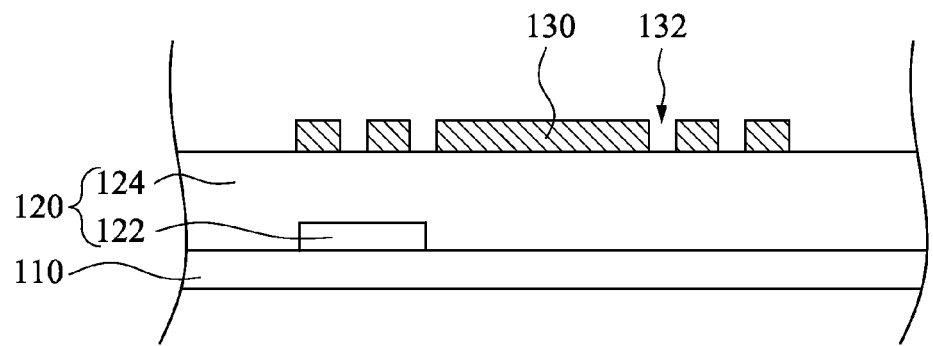
FIGS. 1A to 1E are cross-sectional views of a method for manufacturing a semiconductor device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Currently, many processes use low-k and extreme low-k dielectric materials in inter-metal dielectric (IMD) layers to reduce RC delay and parasitic capacitances. The general trend in IMD designs is that the dielectric constants (k) of the IMD layers tend to decrease from low-k regime to extreme low-k regime. This means that the IMD layers, in which metal lines and vias are formed, are more mechanically fragile. After a metal pad is formed on a low-k dielectric layers, a stress is generated at the interface between the metal pad and the low-k dielectric layers, and potentially causing the delamination of low-k dielectric layers. Therefore, a semiconductor device and a manufacturing method thereof are provided to improve the delamination in the semiconductor device.

FIGS. 1A to 1E are cross-sectional views of a method for manufacturing a semiconductor device in accordance with various embodiments of the present disclosure. Reference is made to FIG. 1A. A semiconductor structure 120 is formed on a substrate 110. In some embodiments, the substrate 110 is a semiconductor substrate such as a bulk silicon substrate, a semiconductor wafer, a silicon-on-insulator (SOI) substrate, or a silicon germanium substrate, although it may include other semiconductor materials such as group III, group IV, and/or group V elements.

For forming the semiconductor structure 120, an electric element 122 is formed in, on and/or above the substrate 110. The electric element 122 may include complementary metal-oxide-semiconductor (CMOS) transistors, diodes, resistors, capacitors, inductors, and other active and passive semiconductor devices. For clarity, single electric element 122 is depicted in FIG. 1A. In other embodiments, however, the number of the electric elements 122 can be plural and are in different types. Subsequently, an interconnect structure 124 is formed on the electric element 122. In some embodiments, the interconnect structure 124 covers the electric element 122. The interconnect structure 124 is configured to interconnect the electric element(s) 122. The interconnect structure 124 includes a plurality of metallization layers including metal lines and vias (not shown) in a plurality of dielectric layers. The metal lines and vias may be formed of copper or copper alloys, and may be formed using the well-known damascene processes. The dielectric layers in the interconnect structure 124 may be made of low-k dielectric material, extreme low-k dielectric material, or silicon.

The low-k dielectric material is a material with a small dielectric constant relative to silicon dioxide, whose dielectric constant is about 3.9, and the extreme low-k dielectric material has a dielectric constant lower than about 2.5. In other embodiments, the interconnect structure 124 may include commonly known inter-layer dielectric (ILDs) and inter-metal dielectrics (IMDs).

Subsequently, a metal pad 130 including at least one through hole 132 is formed on the semiconductor structure 120. In other words, the interconnect structure 124 is formed between the electric element 122 and the metal pad 130. In FIG. 1A, the metal pad 130 has a plurality of through holes 132. For example, a metal layer (not shown) and a photoresist (not shown) can be sequentially formed on the semiconductor structure 120. The photoresist is then exposed and developed to become a patterned photoresist. Subsequently, the metal layer is then etched based on the patterned photoresist to form the metal pad 130. In some embodiments, the metal pad 130 may include aluminum (Al), and hence may also be referred to as an aluminum pad, although it may also be made of copper (Cu), silver (Ag), gold (Au), nickel (Ni), tungsten (W), alloys, or any combination thereof. In other embodiments, the metal pad 130 may be made of aluminum copper (AlCu). The metal pad 130 can be electrically connected to the electric element 122, for example, through the underlying interconnection structure 124.

Figure 1B:
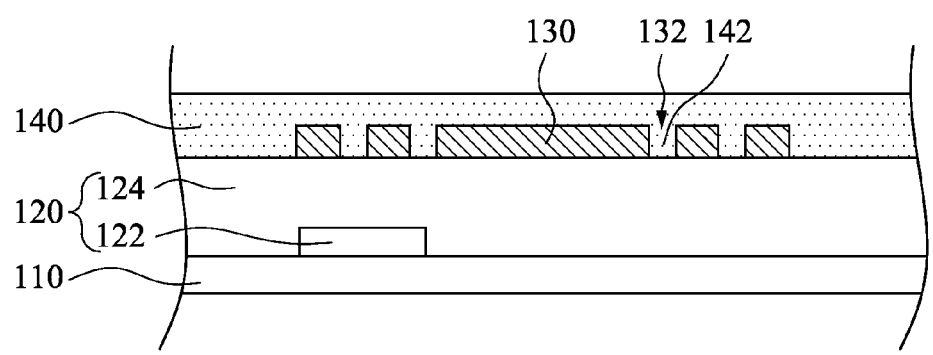

Reference is made to FIG. 1B. Subsequently, a polymer layer 140 is formed to cover the metal pad 130 and the through holes 132. For example, the polymer layer 140 may be coated on the metal pad 130. The portions of the polymer layer 140 filled in the through holes 132 respectively form stress releasing materials 142. In other words, the stress releasing material 142 is a portion of the polymer layer 140. In some embodiments, the polymer layer 140 may be made of polyimide, polyimide derivative, epoxy, benzocyclobutene (BCB), polybenzoxazole (PBO), and the like, although other relatively soft, often organic, dielectric materials can also be used. The material used to form the polymer layer 140 is suitably resilient and exhibits good adhesion to the metal used at the interface surface to the metal pad 130 and a connecting element disposed on the metal pad 130.

Figure 1C:
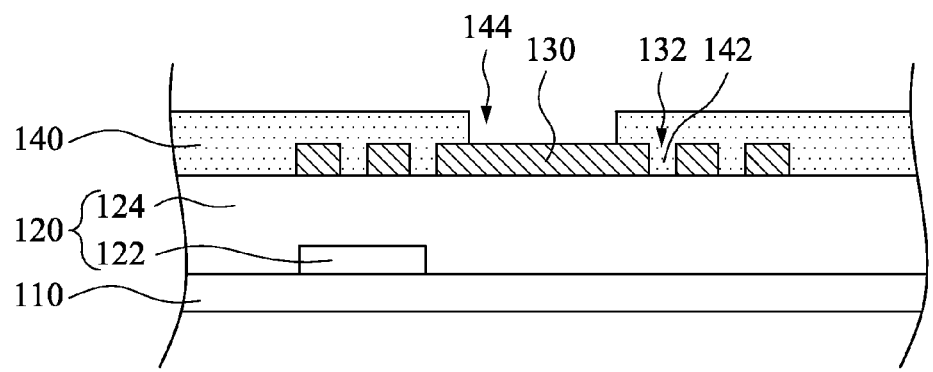

Reference is made to FIG. 1C. A first opening 144 is formed in the polymer layer 140 to expose a portion of the metal pad 130. For example, another photoresist can be formed on the polymer layer 140 of FIG. 1B. Subsequently, the photoresist is exposed and developed to form a patterned photoresist. A portion of the polymer layer 140 is then removed based on the patterned photoresist to form the first opening 144. In FIG. 1C, the first opening 144 does not expose the through holes 132. In other words, the stress releasing materials 144 are not removed in this operation. In some embodiments, the first opening 144 is referred to as an under bump metallization opening since an under bump metallization (UBM) 150 (see FIG. 1D) is formed in the first opening 142.

Figure 1D:
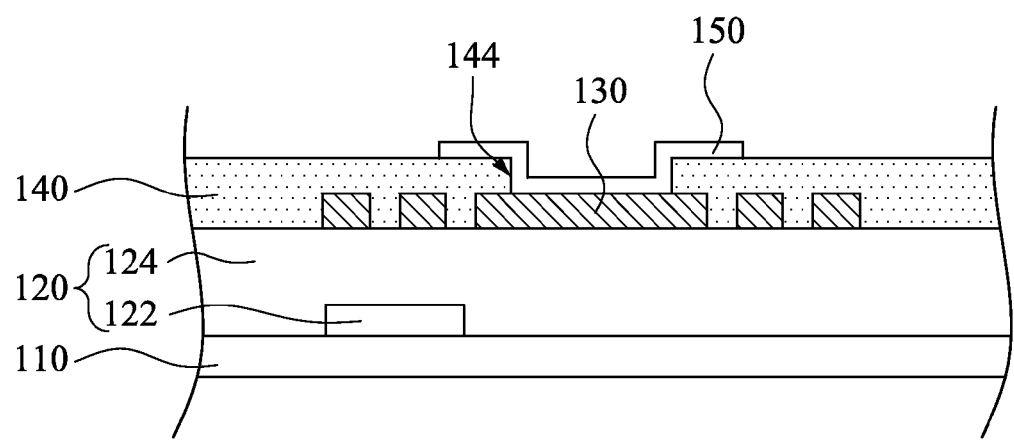

Reference is made to FIG. 1D. An under bump metallization (UBM) 150 is formed on the metal pad 130 and covers the first opening 144. The under bump metallization 150 is filled into the first opening 144 and contacts the metal pad 130. In some embodiments, the under bump metallization 150 is formed of a composite layer including a titanium layer and a copper layer over the titanium layer. In other embodiments, the under bump metallization 150 may include other metal layers made of titanium (Ti), titanium nitride (TiN), tantalum (Ta), tantalum nitride (TaN), tungsten (W), titanium tungsten, nickel (Ni), gold (Au), chrome (Cr), copper (Cu), or copper alloy. Any suitable materials or layers of material that may be used for the under bump metallization are fully intended to be included within the scope of the current disclosure. In some embodiments, the under bump metallization 150 is formed by plating. For example, a metallization layer can be formed on the metal pad 130. Once the metallization layer has been formed, portions of the metallization layer may then be removed through a suitable photolithographic masking and etching process to remove the undesired material and to leave the under bump metallization 150 in a desired shape, such as a circular, octagonal, square, or rectangular shape, although any desired shape may alternatively be formed. The under bump metallization 150 may include a portion inside the first opening 144 and additional portions over the polymer layer 140. The portion of the under bump metallization 150 inside the first opening 144 electrically connects an overlying metal bump 160 (see FIG. 1E) to the underlying metal pad 130. In some embodiments, the under bump metallization 150 and underlying metal pad 130 in combination are referred to as a bump pad structure.

Figure 1E:
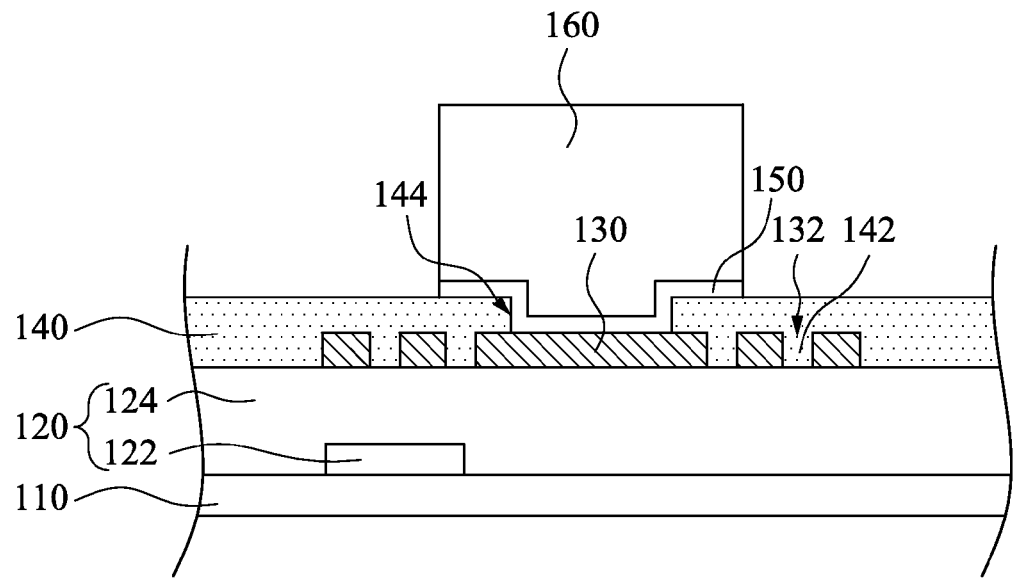

Reference is made to FIG. 1E. A metal bump 160 is formed on the under bump metallization 150 and above the metal pad 130. In other words, the under bump metallization 150 is formed between the metal bump 160 and the metal pad 130. The metal bump 160 may be formed by a mask (not shown) over the under bump metallization 150, patterning the mask to form an opening, through which a portion of the under bump metallization 150 is exposed, and plating a metallic material into the opening in the mask. The metallic material may include copper, copper containing impurities, and copper alloys containing minor amounts of elements such as tantalum (Ta), indium (In), tin (Sn), zinc (Zn), manganese (Mn), chromium (Cr), titanium (Ti), germanium (Ge), strontium (Sr), platinum (Pt), magnesium (Mg), aluminum (Al), or zirconium (Zr), and hence the resulting metal bump 160 is referred to as a copper bump, although other metals may be used. The mask is then removed. In other embodiments, the formation methods may include sputtering, printing, electro plating, electroless plating, and commonly used chemical vapor deposition (CVD) methods. Therefore, the manufacturing of the semiconductor device is complete.

From the structural point of view, the semiconductor device of FIG. 1E includes the substrate 110, the semiconductor structure 120, the metal pad 130, and the stress releasing material 142. The semiconductor structure 120 is disposed on the substrate 110. The metal pad 130 is disposed on the semiconductor structure 120. The metal pad 130 includes the through hole 132 therein. The stress releasing material 142 is disposed in the through hole 132. In other words, the stress releasing material 142 is disposed on the semiconductor structure 120, and the metal pad 130 surrounds around the stress releasing material 142.

In some embodiments, the semiconductor structure 120 includes an electric element 122 and an interconnect structure 124. The electric element 122 is disposed on or above the substrate 110. The interconnect structure 124 is disposed between the electric element 122 and the metal pad 130. The electric element 122 is electrically connected to the metal pad 130 through the interconnect structure 124.

As mentioned above, a portion of the semiconductor structure 120 may be made of low-k dielectric material, extreme low-k dielectric material, silicon, or combination thereof. In other words, the semiconductor structure 120 may include low-k dielectric layers, extreme low-k dielectric layers, silicon layers, or combination thereof. These layers may experience compressive force during a wire bonding process or after epoxy encapsulation. These strains or stresses could cause damage or destruction of the semiconductor structure 120, such as by causing interfacial delamination of the metal pad 130 and the low-k dielectric layers.

In contrast, in FIG. 1E, since the stress releasing material 142 is disposed in the through hole 132 of the metal pad 130, the stress releasing material 142 can reduce accumulated strain or stress at the interfaces between the metal pad 130 and the semiconductor structure 120. The number of the stress releasing material 142 can be plural, and the stress releasing material 142 may be made of polyimide, polyimide derivative, epoxy, benzocyclobutene (BCB), polybenzoxazole (PBO), and the like, although other relatively soft, often organic, dielectric materials can also be used.

Figure 2:
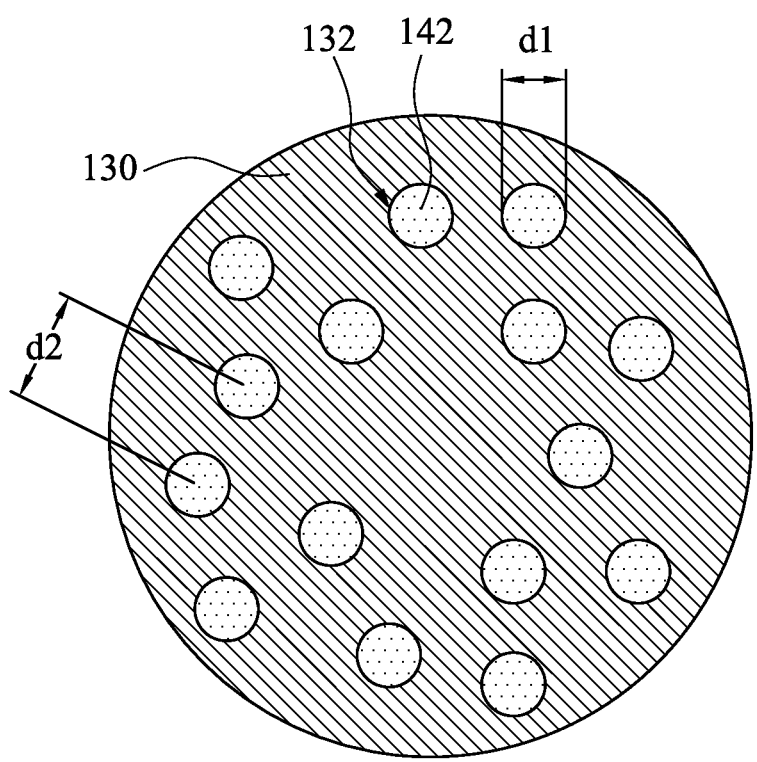
FIG. 2 is a top view of a metal pad and a stress releasing material of FIG. 1E.

FIG. 2 is a top view of the metal pad 130 and the stress releasing materials 142 of FIG. 1E. In some embodiments, the through hole 132 (or the stress releasing material 142) has a diameter d1 ranging from about 2 um to about 5 um. Within this range, the stress releasing material 142 has good stress releasing ability without increasing the resistance of the metal pad 130. Moreover, a distance d2 between adjacent two of the through holes 132 (or the stress releasing materials 142) is about 2 um to about 5 um, which also makes the stress releasing materials 142 have good stress releasing ability without increasing the resistance of the metal pad 130.

Reference is made again to FIG. 1E. In some embodiments, the semiconductor device further includes a polymer layer 140 disposed on the semiconductor structure 120 and covering a portion (the edge portion) of the metal pad 130 and the stress releasing materials 142. The polymer layer 140 has a first opening 144 to expose another portion (the center portion) of the metal pad 130. Moreover, the through holes 132 are disposed outside an area of the first opening 144 projected on the metal pad 130. That is, the through holes 132 are filled with the polymer to form the stress releasing materials 142 when the polymer layer 140 is coated on the metal pad 130, and the portion of the polymer layer 140 corresponding to the first opening 144 is removed, while the stress releasing materials 142 are still filled in the through holes 132.

In some embodiments, the semiconductor further includes a metal bump 160 and an under bump metallization 150. The metal bump 160 is disposed on or above the metal pad 130. The under bump metallization 150 is disposed between the metal bump 160 and the metal pad 130. In some embodiments, the metal pad 130 is made of aluminum, which may form an oxide upon exposure to air, and this native oxide is an electrical insulator. A wire formed above the oxide may have bad electrical connection to the metal pad 130. The under bump metallization 150, therefore, can be formed on the metal pad 130 to improve the electrical connection. The under bump metallization 150 provides a strong, stable, low resistance electrical connection to the metal pad 130 (such as an aluminum pad). The under bump metallization 150 can adhere well both to the metal pad 130 and to the polymer layer 140, hermetically sealing the metal pad 130 from the environment. The under bump metallization 150 also can provide a strong barrier to prevent the diffusion of metal bump 160 into the metal pad 130 and the semiconductor structure 120. The under bump metallization 150 may include a single or multiple layers.

Figure 3:
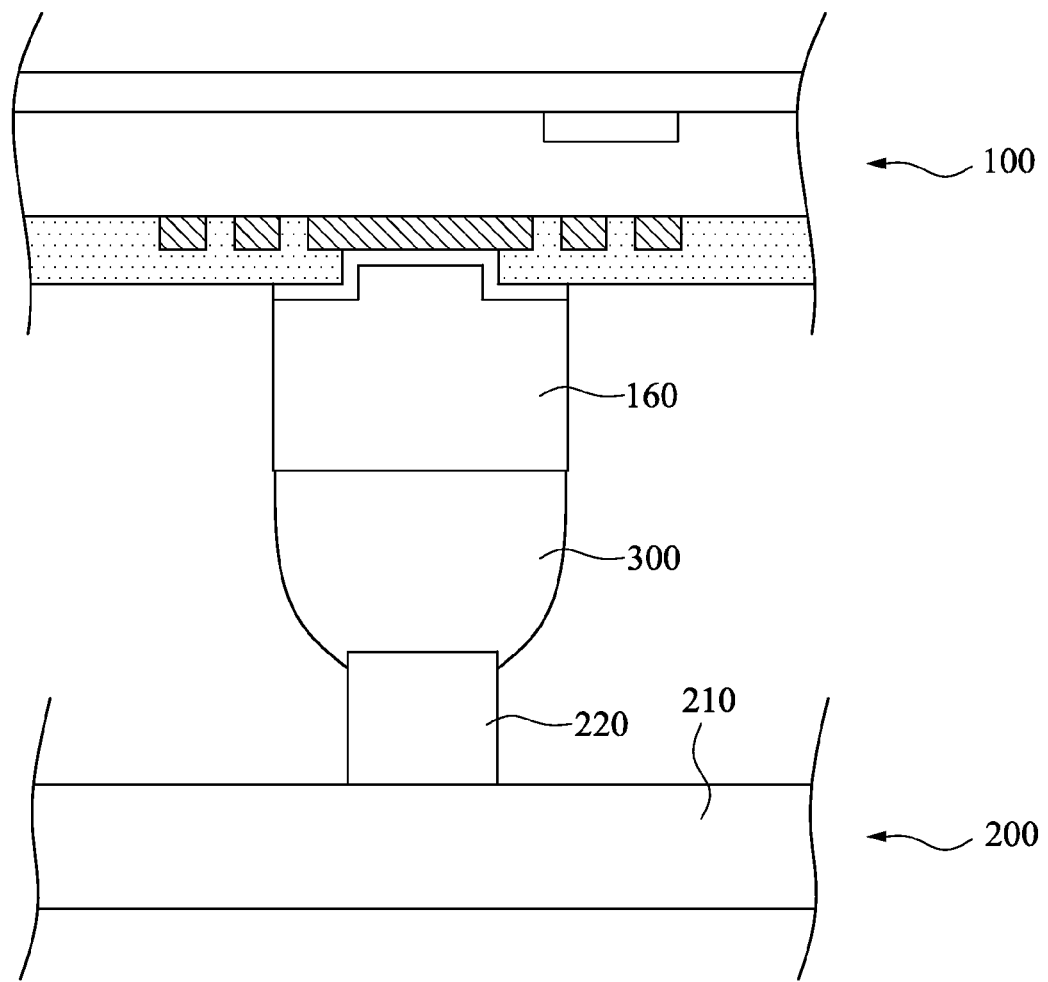
FIG. 3 is a cross-sectional view of an integrated circuit structure in accordance with various embodiments of the present disclosure.

FIG. 3 is a cross-sectional view of an integrated circuit structure in accordance with various embodiments of the present disclosure. The integrated circuit structure includes a first semiconductor device 100, a second semiconductor device 200, and a connecting structure 300. In some embodiments, the first semiconductor device 100 has substantially the same structure as the semiconductor device of FIG. 1E. The connecting structure 300 electrically interconnects the first semiconductor device 100 and the second semiconductor device 200. In some embodiments, the first semiconductor device 100 and the second semiconductor device 200 can be semiconductor chips, packaging devices, interposer devices, or other suitable electric devices. For example, the second semiconductor device 200 in FIG. 3 includes a substrate 210 and a metal trace 220 disposed on the substrate 210 and attached to the connecting structure 300. However, the claimed scope of the present disclosure is not limited in this respect.

The connecting structure 300, may be a solder ball, is mounted between the metal bump 160 of the first semiconductor device 100 and the metal trace 220 of the second semiconductor device 200. In some embodiments, the connecting structure 300 is made of a lead-free solder material including, for example, SnAg, SnAgCu, and the like, although the connecting structure 300 may also be made of eutectic solder material including, for example, lead (Pb) and tin (Sn).

To connect the first semiconductor device 100 and the second semiconductor device 200, the connecting structure 300 can be formed on the metal bump 160 in advance. Once the connecting structure 300 is formed, a reflow may be performed in order to shape the solder material into the desired shape. Then, the first semiconductor device 100 and the second semiconductor device 200 are bonded through flip-chip bonding. The connecting structure 300 joints the first semiconductor device 100 and the second semiconductor device 200 together.

FIGS. 4A to 4E are cross-sectional views of a method for manufacturing a semiconductor device in accordance with various embodiments of the present disclosure. The manufacturing process of FIG. 1A is performed previously. Since the relevant manufacturing details are all the same as the embodiment in FIG. 1A, and, therefore, a description in this regard will not be repeated hereinafter. Subsequently, a passivation layer 170 is formed to cover the metal pad 130 and the through holes 132. The passivation layer 170 may be made of polyimide or polybenzoxazole (PBO). Alternatively, the passivation layer 170 may be made of other dielectric materials, such as silicon oxide, silicon oxynitride, silicon nitride, un-doped silicate glass (USG), and/or multi-layers thereof.

Figure 4A:
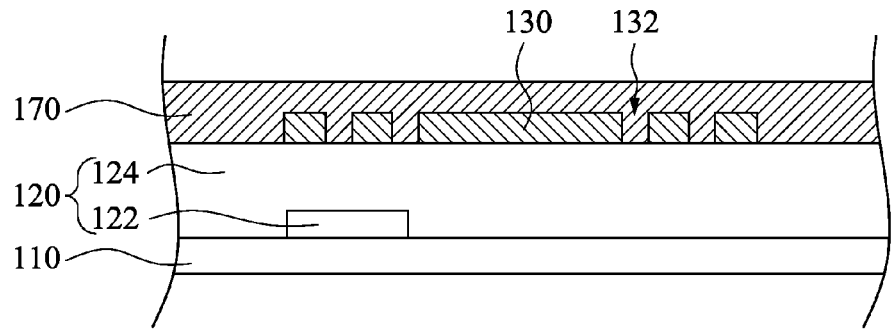
FIGS. 4A to 4E are cross-sectional views of a method for manufacturing a semiconductor device in accordance with various embodiments of the present disclosure.
Figure 4B:
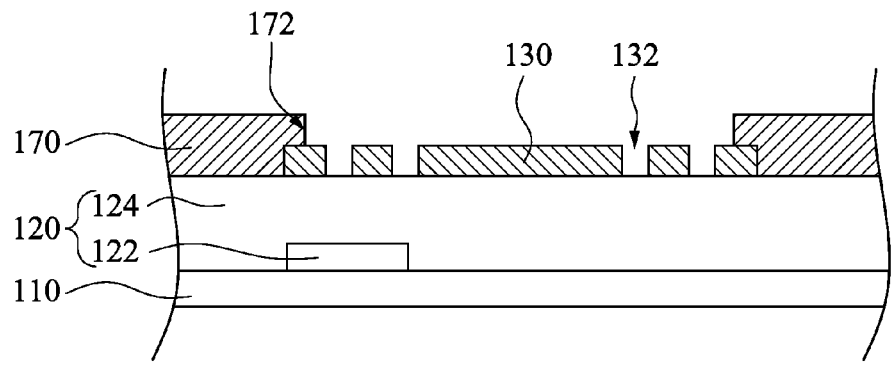

Reference is made to FIG. 4B. Subsequently, a second opening 172 is formed in the passivation layer 170 to expose a portion of the metal pad 130 and the through holes 132. For example, a photoresist can be formed on the passivation layer 170 of FIG. 4A. Subsequently, the photoresist is exposed and developed to form a patterned photoresist. A portion of the passivation layer 170 is removed based on the patterned photoresist to form the second opening 172, and the patterned photoresist is the removed. In FIG. 4B, the second opening 172 expose all of the through holes 132.

Figure 4C:
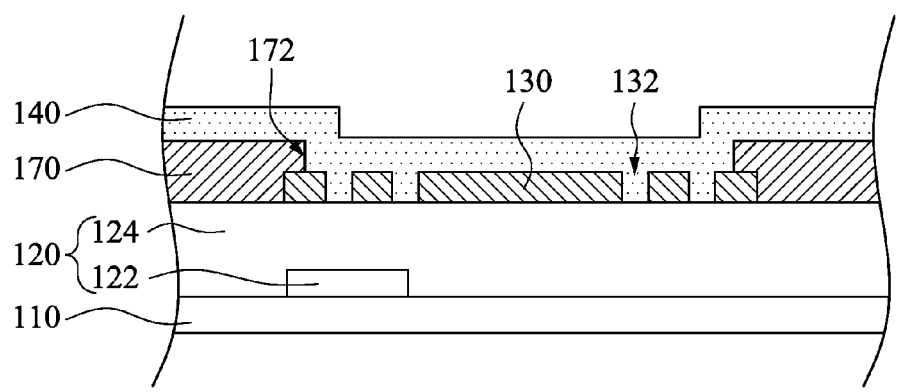

Reference is made to FIG. 4C. A polymer layer 140 is formed to cover the metal pad 130, the through holes 132, and the passivation layer 170. For example, the polymer layer 140 may be coated on the metal pad 130 and the passivation layer 170. The portions of the polymer layer 140 filled in the through holes 132 respectively form stress releasing materials 142. In some embodiments, the polymer layer 140 may be made of polyimide, polyimide derivative, epoxy, benzocyclobutene (BCB), polybenzoxazole (PBO), and the like, although other relatively soft, often organic, dielectric materials can also be used.

Figure 4D:
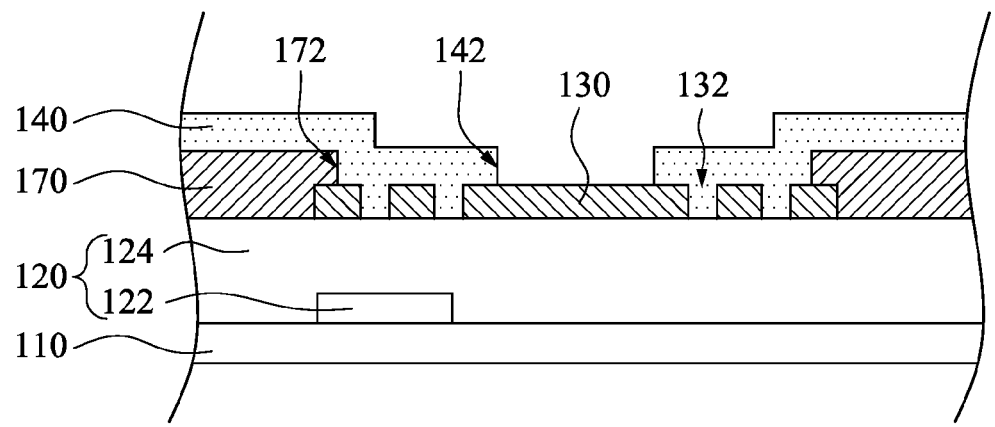

Reference is made to FIG. 4D. A first opening 144 is formed in the polymer layer 140 to expose a portion of the metal pad 130. For example, another photoresist can be formed on the polymer layer 140 of FIG. 4C. Subsequently, the photoresist is exposed and developed to form a patterned photoresist. A portion of the polymer layer 140 is then removed based on the patterned photoresist to form the first opening 144. In FIG. 4D, the first opening 144 does not expose the through holes 132. In other words, the stress releasing materials 142 are not removed in this operation.

Figure 4E:
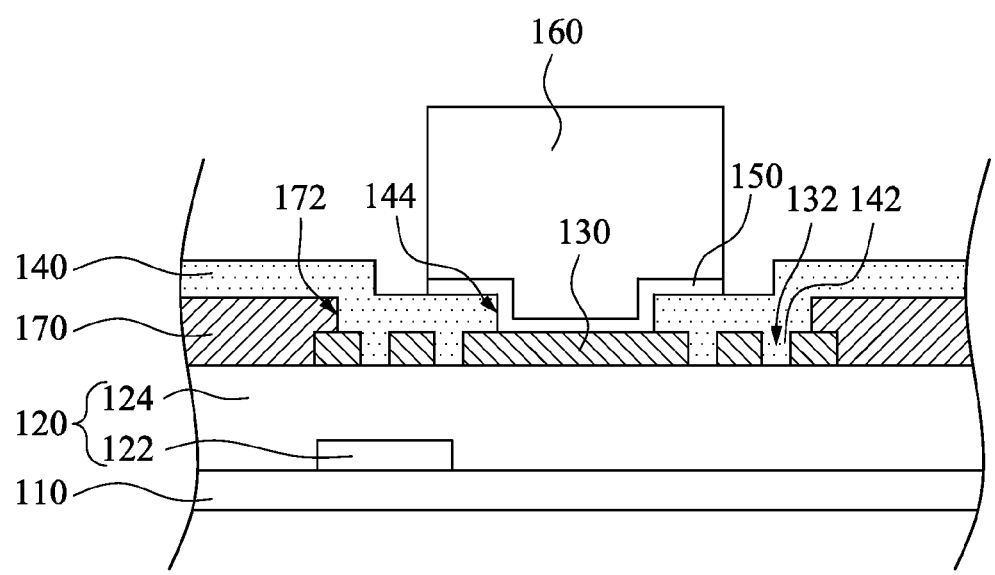

Reference is made to FIG. 4E. An under bump metallization (UBM) 150 is formed on the metal pad 130 and covers the first opening 144. The under bump metallization 150 is filled into the first opening 144 and contacts the metal pad 130. In some embodiments, the under bump metallization 150 is formed of a composite layer including a titanium layer and a copper layer over the titanium layer. In other embodiments, the under bump metallization 150 may include other metal layers made of titanium (Ti), titanium nitride (TiN), tantalum (Ta), tantalum nitride (TaN), tungsten (W), titanium tungsten, nickel (Ni), gold (Au), chrome (Cr), copper (Cu), or copper alloy. Any suitable materials or layers of material that may be used for the under bump metallization 150 are fully intended to be included within the scope of the current disclosure. In some embodiments, the under bump metallization 150 is formed by plating. For example, a metallization layer can be formed on the metal pad 130. Once the metallization layer has been formed, portions of the metallization layer may then be removed through a suitable photolithographic masking and etching process to remove the undesired material and to leave the under bump metallization 150 in a desired shape, such as a circular, octagonal, square, or rectangular shape, although any desired shape may alternatively be formed. The under bump metallization 150 may include a portion inside the first opening 144 and additional portions over the polymer layer 140. The portion of the under bump metallization 150 inside the first opening 144 electrically connects an overlying metal bump 160 to the underlying metal pad 130. In some embodiments, the under bump metallization 150 and underlying metal pad 130 in combination are referred to as a bump pad structure.

Subsequently, a metal bump 160 is formed on the under bump metallization 150 and above the metal pad 130. In other words, the under bump metallization 150 is formed between the metal bump 160 and the metal pad 130. The metal bump 160 may be formed by a mask (not shown) over the under bump metallization 150, pattering the mask to form an opening, through which a portion of the under bump metallization 150 is exposed, and plating a metallic material into the opening in the mask. The metallic material may include copper, copper containing impurities, and copper alloys containing minor amounts of elements such as tantalum (Ta), indium (In), tin (Sn), zinc (Zn), manganese (Mn), chromium (Cr), titanium (Ti), germanium (Ge), strontium (Sr), platinum (Pt), magnesium (Mg), aluminum (Al), or zirconium (Zr), and hence the resulting metal bump 160 is referred to a copper bump, although other metals may be used. The mask is then removed. In other embodiments, the formation methods may include sputtering, printing, electro plating, electroless plating, and commonly used chemical vapor deposition (CVD) methods. Therefore, the manufacturing of the semiconductor device is complete.

From the structural point of view, the difference between the semiconductor devices in FIGS. 4E and 1E pertains to the presence of the passivation layer 170. In FIG. 4E, the passivation layer 170 is disposed between the polymer layer 140 and the semiconductor structure 120. The passivation layer 170 has a second opening 172 to expose the stress releasing material 142.

In FIG. 4E, the through holes 132 of the metal pad 130 are disposed inside an area of the second opening 172 projected on the metal pad 130. Therefore, the through holes 132 can be exposed by the passivation layer 170, and the stress releasing materials 142 can be formed in the through holes 132 in operation of FIG. 4D. In FIG. 4E, the second opening 172 is wider than the first opening 144, and the metal pad 130 is wider than the second opening 172.

In some embodiments, the first semiconductor device 100 of FIG. 3 can have the same structure as the semiconductor device in FIG. 4E, and the claimed scope of the present disclosure is not limited in this respect. That is, the first semiconductor device 100 of FIG. 3 can include a passivation layer disposed between the metal pad and the polymer layer. Basically, embodiments fall within the claimed scope of the present disclosure if a stress releasing material disposed in the through hole of the metal pad.

If the semiconductor structure includes low-k dielectric layer, extreme low-k dielectric layer, or silicon layer, they may experience compressive force during a wire bonding process or after epoxy encapsulation. However, in the aforementioned embodiments, since the stress releasing material is disposed in the through hole of the metal pad, the stress releasing material can reduce accumulated strain or stress at the interfaces between the metal pad and the semiconductor structure, improving the delamination between the metal pad and the semiconductor structure.

An aspect of the present disclosure is to provide a semiconductor device including a substrate, a semiconductor structure, a metal pad, and a stress releasing material. The semiconductor structure is disposed on the substrate. The metal pad is disposed on the semiconductor structure. The metal pad includes a through hole therein. The stress releasing material is disposed in the through hole.

Another aspect of the present disclosure is to provide an integrated circuit structure including a first semiconductor device, a second semiconductor device, and a connecting structure. The first semiconductor device includes a substrate, a semiconductor structure, a stress releasing material, and a metal pad. The semiconductor structure is disposed on the substrate. The stress releasing material is disposed on the semiconductor structure. The metal pad surrounds the stress releasing material and is electrically connected to the semiconductor structure. The connecting structure electrically interconnects the first semiconductor device and the second semiconductor device.

Still another aspect of the present disclosure is to provide a method for manufacturing a semiconductor device including forming a semiconductor structure on a substrate. A metal pad including a through hole is formed on the semiconductor structure. A polymer layer is formed to cover the metal pad and the through hole. The portion of the polymer layer filled in the through hole forms a stress releasing material. A first opening is formed in the polymer layer to expose a portion of the metal pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate;
   a semiconductor structure disposed on the substrate;
   a metal pad disposed on the semiconductor structure, wherein the metal pad includes a through hole therein;
   a stress releasing material disposed in the through hole;
   a polymer layer disposed on the semiconductor structure and covering a portion of the metal pad and the stress releasing material, the polymer layer having a first opening to expose another portion of the metal pad; and
   a conductive layer present on a top surface of the polymer layer and electrically connected to the exposed portion of the metal pad through the first opening.

2. The semiconductor device of claim 1, wherein the stress releasing material is a portion of the polymer layer.

3. The semiconductor device of claim 1, wherein the through hole is disposed outside an area of the first opening projected on the metal pad.

4. The semiconductor device of claim 1, further comprising:
   a passivation layer disposed between the polymer layer and the semiconductor structure, wherein the passivation layer has a second opening to expose the stress releasing material.

5. The semiconductor device of claim 4, wherein the through hole is disposed inside an area of the second opening projected on the metal pad.

6. The semiconductor device of claim 1, further comprising:
   a metal bump disposed on or above the metal pad.

7. The semiconductor device of claim 6, wherein the conductive layer is disposed between the metal bump and the metal pad.

8. The semiconductor device of claim 1, wherein the semiconductor structure comprises:
   an electric element disposed on or above the substrate; and
   an interconnect structure disposed between the electric element and the metal pad, wherein the electric element is electrically connected to the metal pad through the interconnect structure.

9. The semiconductor device of claim 1, wherein the through hole has a diameter ranging from about 2 um to about 5 um.

10. The semiconductor device of claim 1, wherein a distance between adjacent two of the through holes is about 2 um to about 5 um.

11. The semiconductor device of claim 1, wherein the metal pad is made of aluminum.

12. The semiconductor device of claim 1, wherein the stress releasing material is made of polyimide, polyimide derivative, epoxy, benzocyclobutene (BCB), polybenzoxazole (PBO), or combinations thereof.

13. An integrated circuit structure comprising:
   a first semiconductor device, comprising:
      a substrate;
      a semiconductor structure disposed on the substrate;
      a stress releasing material disposed on the semiconductor structure; and
      a metal pad surrounding the stress releasing material and electrically connected to the semiconductor structure;
   a second semiconductor device; and
   a connecting structure electrically interconnecting the first semiconductor device and the second semiconductor device.

14. The integrated circuit structure of claim 13, wherein the second semiconductor device comprises:
   a substrate; and
   a metal trace disposed on the substrate and attached to the connecting structure.

15. The integrated circuit structure of claim 13, wherein the connecting structure is a solder.

16. The integrated circuit structure of claim 13, wherein the first semiconductor device further comprises:
   a polymer layer disposed on the semiconductor structure and covering a portion of the metal pad and the stress releasing material, the polymer layer having a first opening therein.

17. The integrated circuit structure of claim 16, wherein the first semiconductor device further comprises:
   a metal bump present on or above the metal pad and at least partially present in the first opening of the polymer layer.

18. The integrated circuit structure of claim 17, wherein the connecting structure is electrically connected to the first semiconductor device through the metal bump.

19. The integrated circuit structure of claim 16, wherein the first semiconductor device further comprises:
   a passivation layer present between the polymer layer and the semiconductor structure of the first semiconductor device, wherein the passivation layer has a second opening to expose the stress releasing material.

20. The integrated circuit structure of claim 13, wherein the stress releasing material is made of polyimide, polyimide derivative, epoxy, benzocyclobutene (BCB), polybenzoxazole (PBO), or combinations thereof.

* * * * *